(12) United States Patent
Ahn et al.

(10) Patent No.: US 6,338,989 B1
(45) Date of Patent: Jan. 15, 2002

(54) ARRAY SUBSTRATE FOR USE IN LIQUID CRYSTAL DISPLAY DEVICE AND METHOD OF MANUFACTURING THE SAME

(75) Inventors: Byung-Chul Ahn; Soon-Sung Yoo; Young-Hoon Ha, all of Kyongbuk; Yong-Wan Kim, Kyongnam, all of (KR)

(73) Assignee: LG. Philips LCD Co., Ltd., Seoul (KR)

( * ) Notice: Subject to any disclaimer, the term of this patent is extended or adjusted under 35 U.S.C. 154(b) by 0 days.

(21) Appl. No.: 09/630,717

(22) Filed: Aug. 2, 2000

(30) Foreign Application Priority Data

Aug. 2, 1999 (KR) .............................. 99-31743

(51) Int. Cl.[7] .............................................. H01L 21/84
(52) U.S. Cl. ........................ 438/158; 438/30; 438/155
(58) Field of Search ..................... 438/30, 149, 151, 438/155, 158, 161

(56) References Cited

U.S. PATENT DOCUMENTS 6,025,216 A * 2/2000 Ha .............................. 438/151
6,081,308 A * 6/2000 Jeong et al. .................... 438/30
6,252,247 B1 * 6/2001 Sakata et al. .................. 438/158

FOREIGN PATENT DOCUMENTS

| JP | 6-204247 | * | 7/1994 |
| KR | 87-4327 | | 5/1987 |

* cited by examiner

Primary Examiner—Chandra Chaudhari
(74) Attorney, Agent, or Firm—Long Aldridge & Norman LLP (57) ABSTRACT

A 4-mask method of manufacturing an array substrate. First and second masks form a gate line, a gate pad, a data line and a data pad. The data line has a protrusion near a crossing of the gate and data lines. A third mask forms a transparent electrode layer, a source electrode, a drain electrode, a pixel electrode, and exposes channel area. The transparent electrode layer has a similar shape as the data line and the data pad, but a smaller area than the data line and a greater area than the data pad. A second insulating layer is formed over the structure. A fourth mask patterns the second insulating layer to cover the gate line and the gate pad, the first and second insulating layer are patterned to form a gate pad contact hole, and the first insulating layer between the data line and the pixel electrode is patterned.

25 Claims, 6 Drawing Sheets

ARRAY SUBSTRATE FOR USE IN LIQUID CRYSTAL DISPLAY DEVICE AND METHOD OF MANUFACTURING THE SAME

CROSS REFERENCE

This application claims the benefit of Korean Patent Application No. 1999-31743, filed on Aug. 2, 1999, under 35 U.S.C. §119, the entirety of which is hereby incorporated by reference.

BACKGROUND OF THE INVENTION

1. Field of the Invention

The present invention relates to a thin film transistor liquid crystal display (TFT-LCD) device, and more particularly, to an array substrate for use in a TFT-LCD device and a method of manufacturing the same.

2. Description of Related Art

In general, LCD devices includes upper and lower substrates with a liquid crystal layer interposed therebetween. The upper substrate has a color filter and a common filter. The lower substrate has gate lines arranged in a transverse direction, data lines arranged in a longitudinal direction perpendicular to the gate lines, thin film transistors (TFTs) as switching elements arranged near the cross portions of the gate and data lines, and pixel electrodes arranged on regions defined by the gate and the data lines. Each of the TFTs has a gate electrode, a source electrode, and a drain electrode. The gate electrode is extended from the gate line and the source electrode is extended from the data line. The drain electrode is electrically connected with the pixel electrode through a contact hole. The LCD device further includes a pad portion. The pad portion includes a plurality of gate pads and a plurality of data pads. The gate pads serve to apply signal voltages to the gate lines, and the data pads serve to apply data voltages to the data lines. The gate and data pads are beneficially located on a non-display area.

In order to form the array substrate, i.e., the lower substrate, processes such as depositing, photolithography, etching, and stripping are repeated several times. As the processes increase in number, the risk of damage to components, such as the gate and data line, by processing errors increase, resulting in inferior products and a high production cost.

To overcome the problems described above, the overall manufacturing process has been simplified from an early eight-mask process to a five-mask process. The conventional five-mask process is explained hereinafter with reference to the accompanying drawings.

Figure 1:
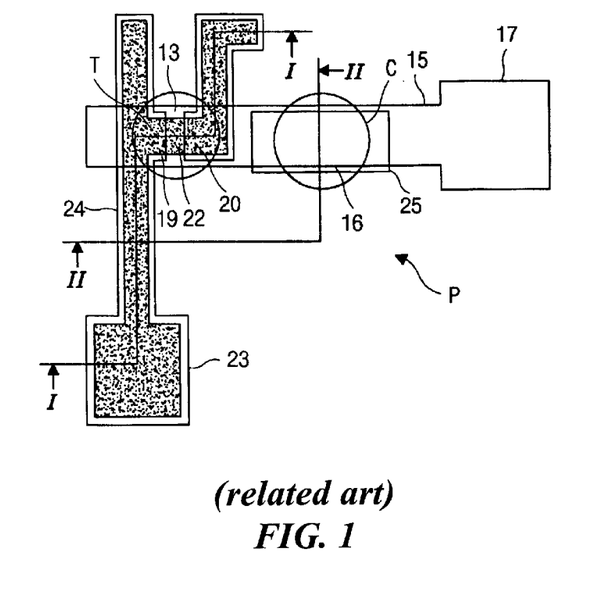
FIG. 1 is a plan view illustrating an array substrate for use in a thin film transistor liquid crystal display (TFT-LCD) device after a third mask step of a conventional five mask manufacturing process.

FIG. 1 is a plan view illustrating an array substrate after a third mask step of the five-mask process is finished. As shown in FIG. 1, the array substrate includes a gate line 15 arranged in a transverse direction, a data line 24 arranged in a longitudinal direction perpendicular to the gate line 15, a TFT "T" arranged near the crossing of the gate and data line 15 and 24, and a pixel region defined by the gate and data lines 15 and 24. The TFT "T" has a gate electrode 13, a source electrode 19 and a drain electrode 20. The gate electrode is a portion of the gate line 15. The source electrode is extended from the data line 24. The drain electrode 20 is spaced apart from the source electrode 19. The TFT "T" further includes a channel area 22. The array substrate further includes gate and data pads 17 and 23. The gate pad connects with the gate line 15, and the data pad 23 connects with the data line 24. The array substrate further includes a storage capacitor "C". As a first capacitor electrode, a portion 16 of the gate line 15 is used, and as a second capacitor electrode, a metal layer 25 is used. In other words, in order to form the storage capacitor "C", the metal layer 25, an insulating layer (not shown), and the portion 16 of the gate line 15 are stacked in a prescribed order.

Figure 2:
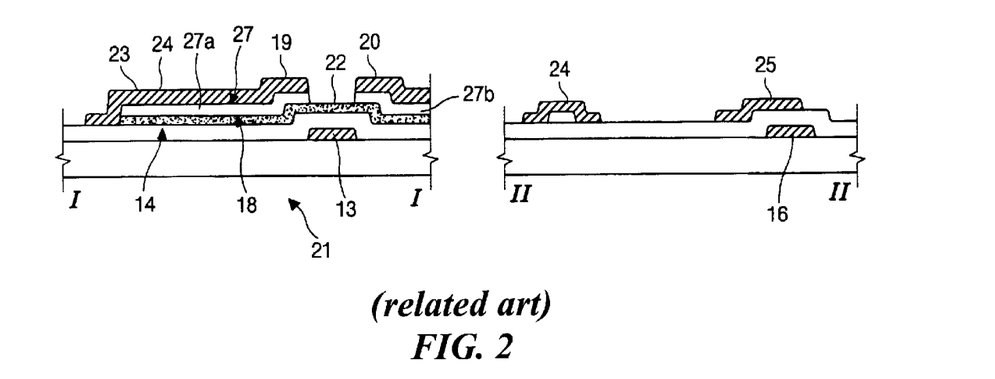
FIG. 2 is a cross sectional view, respectively, taken along lines A—A and B—B of FIG. 1.

FIG. 2 shows cross sectional views, taken along lines A—A and B—B of FIG. 1. FIG. 2 is useful for illustrating the manufacturing process up to the third mask step. First, a metal layer is deposited on a transparent substrate 21 and patterned into the line 15, including the gate electrode 13 and the gate pad 17, through a photolithography process using a first mask. The metal layer is beneficially made of a material selected from a group consisting of Al, Mo, W, Ta and the like. A first insulating layer 14 is deposited on the exposed surface of the substrate 21, covering the gate electrode 13, the gate line 15 and the gate pad 17. The first insulating layer 14 is beneficially made of silicon nitride (SiNx) or silicon oxide (SiOx). Then, an intrinsic amorphous silicon layer and a doped amorphous silicon layer are sequentially deposited on the first insulating layer 14 and then patterned into a semiconductor layer 18 and an ohmic contact layer 27 using a second mask. Next, a conductive metal layer is deposited over the whole surface of the substrate 21 and then is patterned into the source electrode 19, the drain electrode 20, the data line 24 and the data pad 23 using a third mask. At the same time, a portion of the ohmic contact layer 27 over the channel area is etched so that spaced ohmic contact layers 27a and 27b are formed, and the second capacitor electrode 25 is formed in the form of an island. The conductive metal layer is beneficially of Cr or a Cr-alloy.

Figure 3:
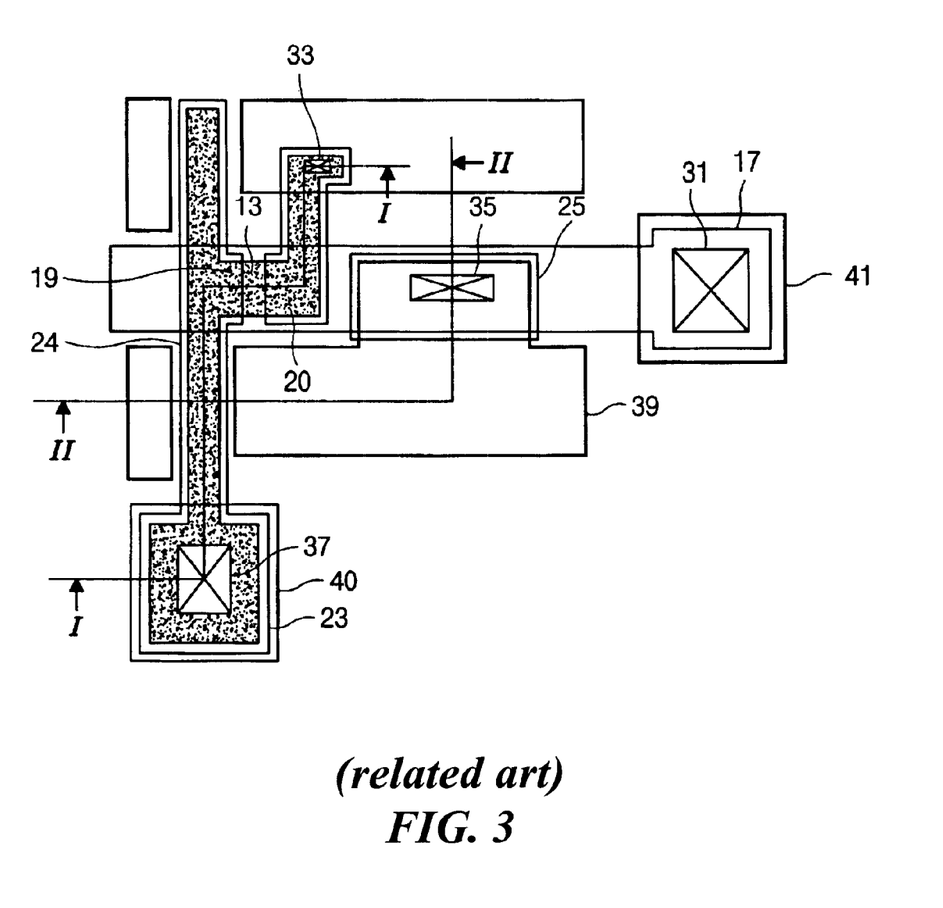
FIG. 3 is a plan view illustrating an array substrate for use in the TFT-LCD device after completion of the five mask steps according to the conventional art.
Figure 4:
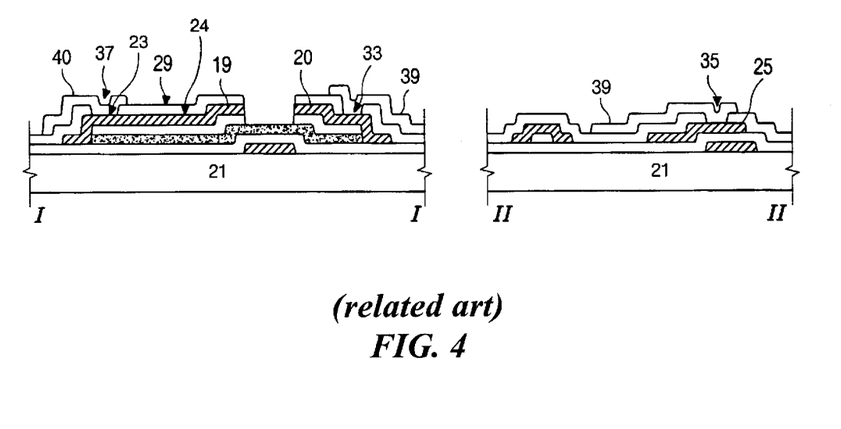
FIG. 4 is a cross sectional view, respectively, taken along lines A—A and B—B of FIG. 3.

FIG. 3 is a plan view illustrating an array substrate completed by the conventional five mask steps, and FIG. 4 is a cross sectional view, respectively, taken along lines A—A and B—B of FIG. 3. Subsequently to FIG. 2, a second insulating layer 29 is deposited over the whole surface while covering the source electrode 19, the data pad 23, the data line 24, and the second capacitor electrode 25. The second insulating layer is then patterned using a fourth mask to form the gate pad contact hole 31 (see FIG. 3), the drain contact hole 33, and the source pad contact hole 37. The gate pad contact hole 31 is formed on the gate pad 17, the drain contact hole 33 is formed on the drain electrode 20, and the data pad contact hole 37 is formed on the data pad 23. Further, at the same time, a capacitor contact hole 35 is formed on the second capacitor electrode 25. Then, a transparent conductive material layer is deposited over the whole surface while filling the contact holes. The transparent conductive material layer is then patterned using a fifth mask to form a pixel electrode 39, a data pad terminal 40, and a gate pad terminal 41. The pixel electrode 39 is formed on the pixel region "P" (see FIG. 1) and contacts the drain electrode 20 through the drain contact hole 33 and the second capacitor electrode 25 through the capacitor contact hole 35. The data pad terminal 40 electronically contacts the source electrode 19 through the data pad contact hole 37. The gate pad terminal 41 contacts the gate pad 17 through the gate pad contact hole 31. The transparent conductive material layer is beneficially made of indium tin oxide (ITO) or indium zinc oxide (IZO).

The manufacturing process of the TFT array substrate using the five mask steps is a big advance over the earlier eight mask steps. However, in the TFT-LCD device, process simplification is one of the most important parameters to lower the inferiority rate of products, lower the production cost, and to increase production yield. Therefore, there is a need for an improved method of manufacturing an array substrate for use in the TFT-LCD device.

SUMMARY OF THE INVENTION

To overcome the problems described above, the principles of the present invention provide for embodiments of an array substrate for use in a thin film transistor liquid crystal display (TFT-LCD) device which can be manufactured with a high production yield using a simplified method of manufacturing.

In order to achieve the above object, the present invention relates to a method of manufacturing an array substrate for use in a thin film transistor liquid crystal display device using only four mask steps. First, a first opaque conductive metal layer and a first transparent conductive metal layer are sequentially deposited on a substrate and then patterned using a first mask to form a gate line and a gate pad. The gate line is connected with the gate pad at end portions thereof. A first insulating layer, an intrinsic semiconductor layer, a doped semiconductor layer and a second opaque conductive metal layer are sequentially deposited on the exposed surface of the substrate while covering the gate line and the gate pad. Those layers are then patterned using a second mask to form a data line and a data pad. The data line is perpendicular to the gate line, and is connected with the data pad at an end portion thereof and has a protruding portion at a crossing area of the gate and data line. The protruding portion extends along a longitudinal direction of the gate line. A second transparent conductive metal layer is then deposited over the substrate while covering the data line and the data pad. The seconding transparent conductive metal layer, the second opaque conductive metal layer and the doped semiconductor layer are then simultaneously patterned using a third mask to form a transparent electrode layer, a source electrode, a drain electrode and a pixel electrode, and to expose a channel area of the intrinsic semiconductor layer. The transparent electrode layer is formed on the data line and the data pad, has the similar shape as the data line and the data pad, but has a smaller area than the data line and a greater area than the data pad. The source and drain electrodes are spaced apart from each other. The pixel electrode extends from the drain electrode. A second insulating layer is then formed over the whole surface of the substrate while covering the transparent electrode layer, the source and drain electrodes and the pixel electrode. Then, a fourth mask is used. The second insulating layer is patterned to cover the gate line and the gate pad. Portions of the first and second insulating layer on the gate pad are simultaneously patterned to form a gate pad contact hole. Furthermore, portions of the first insulating layer between the data line and the pixel electrode are patterned.

The first and second opaque conductive metal layers are beneficially made of aluminum, aluminum alloy, Cr, Mo, W and Ta. The first and second transparent conductive metal layers are beneficially made of one of indium tin oxide and indium zinc oxide. The first insulating layer is beneficially made of one of $SiO_2$ and SiNx, while the second insulating layer is made of $SiO_2$, SiNx, benzocyclobutene (BCB) or acrylic-based resin.

By using the four mask steps according to the principles of the present invention, the manufacturing process can be simplified and processing time can be reduced. Further, the inferiority rate of the products can be decreased, leading to lower production costs and a high production yield.

BRIEF DESCRIPTION OF THE DRAWINGS

For a more complete understanding of the present invention and the advantages thereof, reference is now made to the following descriptions taken in conjunction with the accompanying drawings, in which like reference numerals denote like parts, and in which.

DETAILED DESCRIPTION

Reference will now be made in detail to the embodiment of the present invention illustrated in the accompanying drawings.

Figure 5:
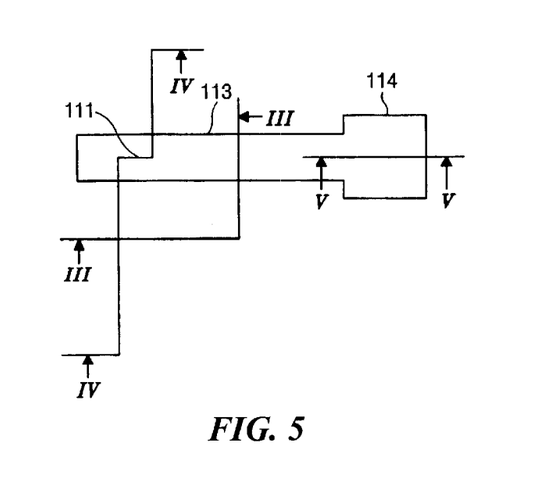
FIG. 5 is a plan view illustrating an array substrate for use in a thin film transistor liquid crystal display (TFT-LCD) device formed by a first mask step according to the principles of the present invention.

FIG. 5 is a plan view illustrating an array substrate for use in a thin film transistor liquid crystal display (TFT-LCD) device formed by a first mask step according to the principles of the present invention. As shown in FIG. 5, the array substrate includes a gate electrode 111, a gate line 113 and a gate pad 114. The gate electrode 111 is a portion of the gate line 113, and the gate line 113 is arranged in a transverse direction and is connected with the gate pad 114 at its end portion.

Figure 6:
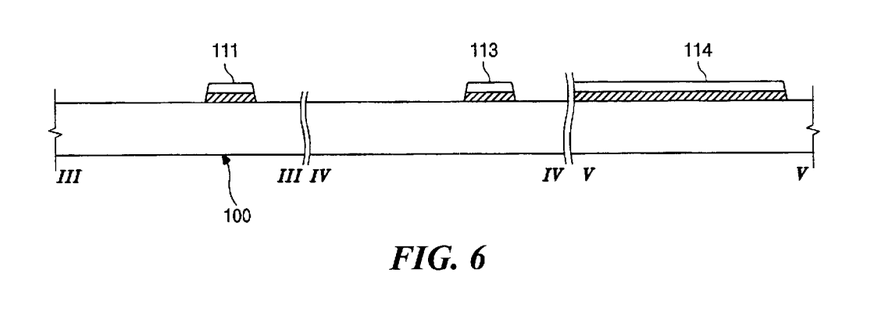
FIG. 6 shows cross sectional views, taken along lines C—C, D—D and E—E of FIG. 5.

FIG. 6 shows a cross sectional view, respectively, taken along lines C—C, D—D and E—E of FIG. 5. A first metal layer and a second metal layer are sequentially deposited on a transparent substrate 100 and then patterned using the first mask to form the gate electrode 111, the gate line 113 and the gate pad 114. In other words, the gate electrode 111, the gate line 113 and the gate pad 114 have a dual-layered structure. The first metal layer is beneficially made of aluminum or aluminum alloy, and the second metal layer is beneficially made of a transparent conductive material such as indium tin oxide (ITO) and indium zinc oxide (IZO). Aluminum and aluminum alloy have low resistance and thus have an advantage that any signal delay is small. But, since pure aluminum has a low tolerance to chemicals, hillocks may occur during a high temperature process. Therefore, it is preferred that pure aluminum is anodized to form $Al_2O_3$, or a metal layer such as chrome (Cr) that is tolerant of chemicals and a high temperature is deposited on the aluminum. In the preferred embodiment of the present invention, in order to protect the gate line, the transparent conductive material layer is deposited to form the dual-layered structure.

Figure 7:
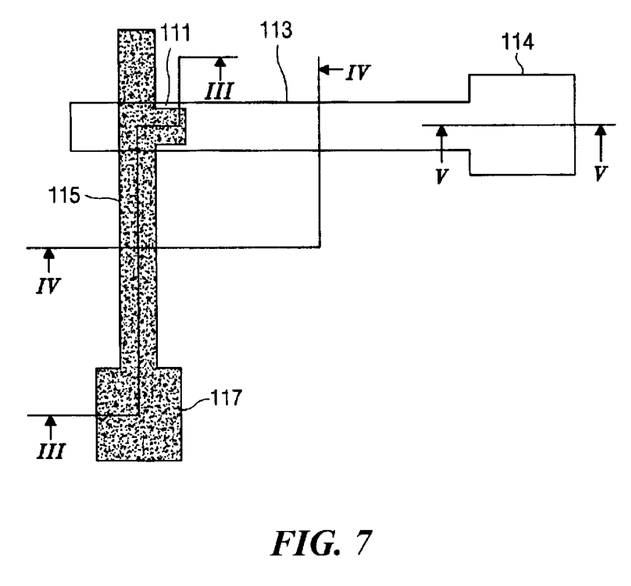
FIG. 7 is a plan view illustrating an array substrate for use in the TFT-LCD device formed by a second mask step according to the principles of the present invention.

FIG. 7 is a plan view illustrating an array substrate for use in the TFT-LCD device formed after a second mask step according to the principles of the present invention. As shown in FIG. 7, the array substrate further includes a data line 115 and a data pad 117. The data line 115 is arranged in a longitudinal direction perpendicular to the gate line 113 and is connected with the data pad 117 at its end portion. The data line 115 includes a protruding portion on the gate electrode 111.

Figure 8:
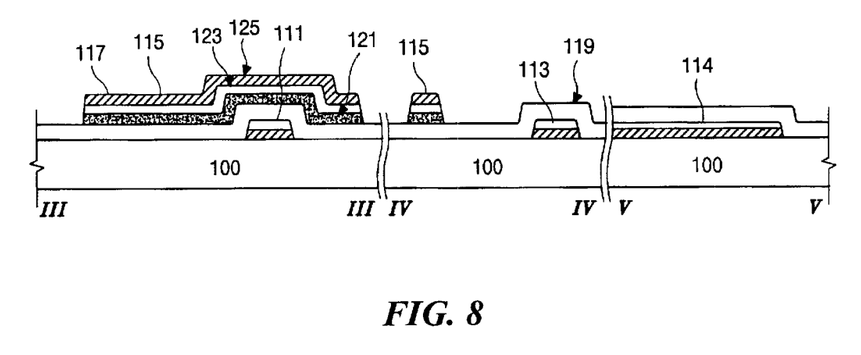
FIG. 8 shows cross sectional views taken along lines C—C, D—D and E—E of FIG. 7.

FIG. 8 shows cross sectional views taken along lines C—C, D—D and E—E of FIG. 7. As shown in FIG. 8, subsequently to FIG. 6, a first insulating layer 119, an intrinsic semiconductor layer 121, a doped semiconductor layer 123 and a third metal layer 125 are sequentially formed on the exposed surface of the substrate 100 while covering the gate electrode 111, the gate line 113 and the gate pad 114, then patterning is performed using the second mask to form the data line 115 and the data pad 117. The first insulating layer 119 is beneficially made of a material selected from a group consisting of SiO2, SiNx, benzocyclobutent (BCB) and acrylic-based resin. The intrinsic semiconductor layer 121 is beneficially made of amorphous silicon, and the doped semiconductor layer 123 is beneficially made of amorphous silicon with impurities. The third metal layer 125 is beneficially made of a material selected from a group consisting of Cr, Mo, W, Ta and the like. At this point, the intrinsic semiconductor layer 121 is used as a channel area of the TFT.

Figure 9:
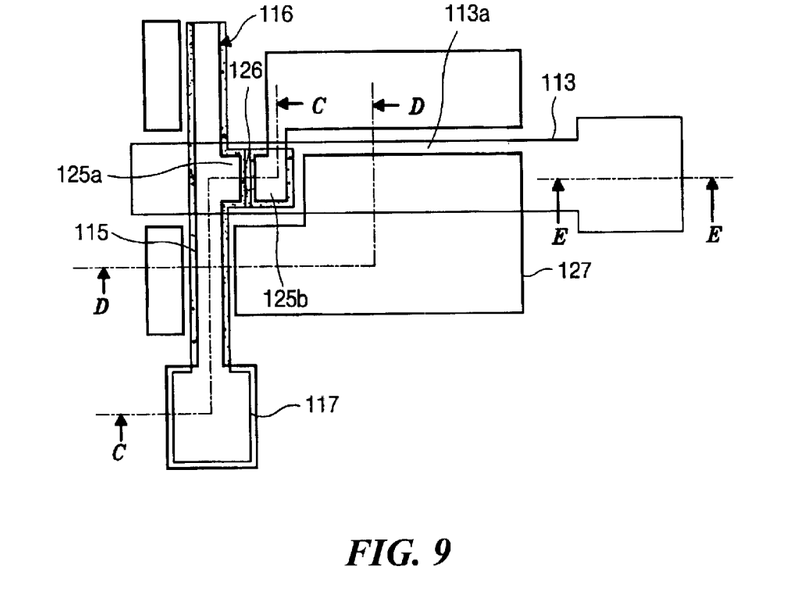
FIG. 9 is a plan view illustrating an array substrate for use in the TFT-LCD device formed by a third mask step according to the principles of the present invention.

FIG. 9 is a plan view illustrating an array substrate for use in the TFT-LCD device formed by a third mask step according to the principles of the present invention. As shown in FIG. 9, the array substrate further includes a transparent electrode layer 116, a source electrode 125a, a drain electrode 125b, and a pixel electrode 127. The transparent electrode layer 116 is formed on the data line 115 and the data pad 117, and has a smaller area than the data line 115 and a greater area than the data pad 117. The protruding portion of the data line 115 is transformed into the source electrode 125a and the drain electrode 125b.

Figure 10:
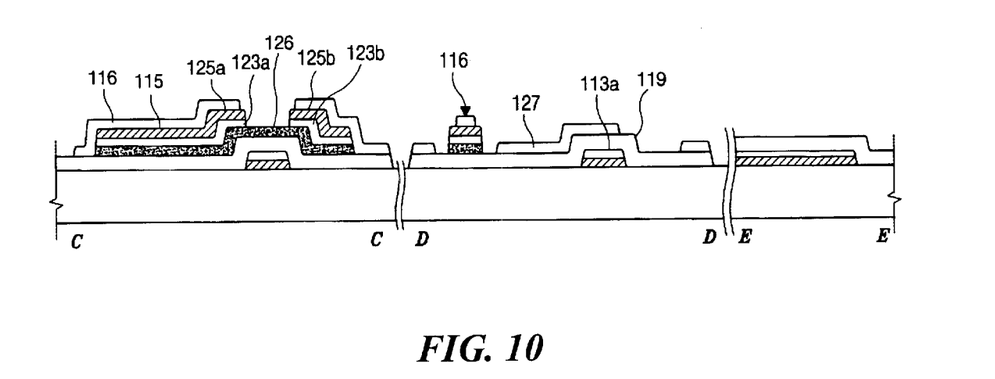
FIG. 10 shows cross sectional views taken along lines C—C, D—D and E—E of FIG. 9.

FIG. 10 shows cross sectional views taken along lines C—C, D—D and E—E of FIG. 9. As shown in FIG. 10, subsequently to FIG. 8, a transparent electrode material layer is deposited over the whole surface of the substrate 100, covering the data line 115 and the data pad 117. That transparent electrode material is pattered using the third mask to form the transparent electrode layer 116, the source electrode 125a, the drain electrode 125b, and the pixel electrode 127. At this point, the transparent electrode 116 is formed in a similar shape to the data line 115 and the data pad 117. The protruding portion of the data line 115 is etched at the same time as the doped semiconductor layer 123 to form source and drain electrodes 125a and 125b that are spaced apart from each other, and to expose a channel area 126. The pixel electrode 127 overlaps the drain electrode 125b and also overlaps over a portion 113a of the gate line 113. The portion 113a of the gate line 113 acts as a first capacitor electrode and the overlapped portion of the pixel electrode 127 acts as a second capacitor electrode. In other words, the pixel electrode 127, the first insulating layer 119 and a portion 113a of the gate line 113 form a storage capacitor "C" (see FIG. 11) having a MIM (metal/insulator/metal) structure. The doped semiconductor layers 123a and 123b act as ohmic contact layers to lower the contact resistance between the channel area 126 and the source and drain electrodes 125a and 125b.

Figure 11:
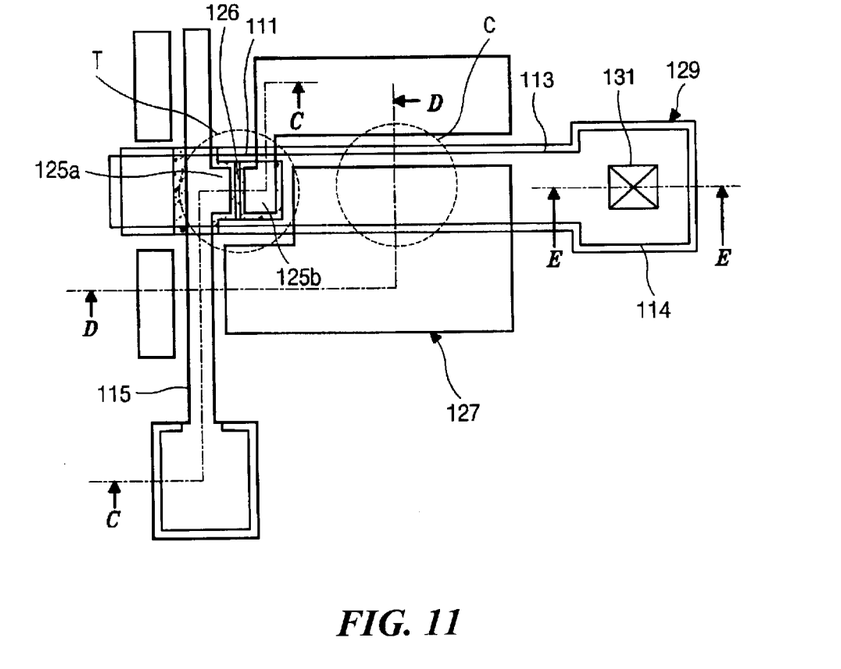
FIG. 11 is a plan view illustrating an array substrate for use in the TFT-LCD device formed by a fourth mask step according to the priciples of the present invention.

FIG. 11 is a plan view illustrating an array substrate for use in the TFT-LCD device formed by a fourth mask step according to the principles of the present invention. As shown in FIG. 11, the array substrate further includes a passivation film 129 and a gate pad contact hole 131.

Figure 12:
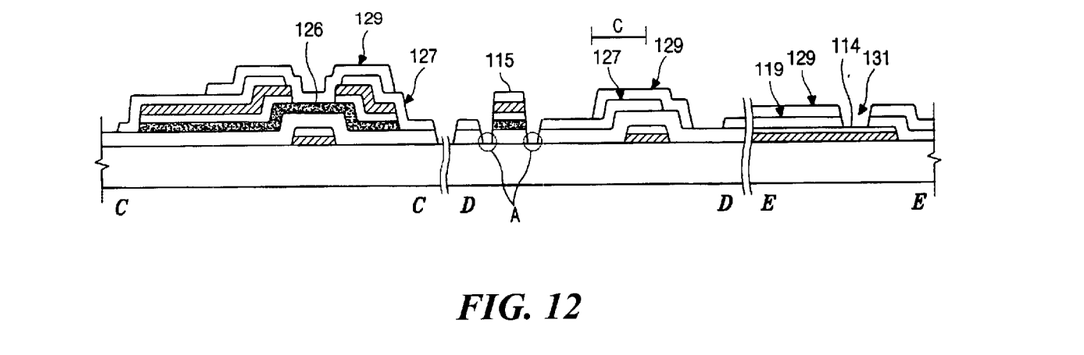
FIG. 12 shows cross sectional views taken along lines C—C, D—D and E—E of FIG. 11.

FIG. 12 shows cross sectional views taken along lines C—C, D—D and E—E of FIG. 11. As shown in FIG. 12, subsequently to FIG. 10, a passivation film 129 as a second insulating layer is formed over the whole surface of the substrate 1 while covering the TFT "T" and the storage capacitor "C". The passivation film 129 is made of an insulating material such as $SiO_2$, SiNx, benzocyclobutene (BCB) or acrylic-based resin. Then, using the fourth mask, portions of the first insulating layer 119 and the passivation film 129 on the gate pad 114 are simultaneously etched to form the gate pad contact hole 131. Further, portions "A" of the first insulating layer 119 between the data line 115 and the pixel electrode 129, which are spaced apart from each other, are etched so that a coupling effect is reduced. The gate pad 114 is electrically connected with a gate drive integrated circuit (IC) (not shown) through the gate pad contact hole 131. Further, the passivation film 129 is formed similarly to the gate line 113. In other words, the passivation film 129 is formed over the gate line 113 and has an area and a width enough to cover the gate line 113, whereupon the passivation film 129 covers and protects important components of the TFT "T": the source electrode 125a; the drain electrode 125b; and the channel area 126.

As described herein before, by using a four mask step process according to the principles of the present invention, the manufacturing process can be simplified and the processing time can be reduced. Further, the inferiority rate of the products can be decreased, leading to a lower production cost and a high production yield.

While the invention has been particularly shown and described with reference to an illustrated embodiment thereof, it will be understood by those skilled in the art that the foregoing and other changes in form and details may be made therein without departing from the spirit and scope of the invention.

What is claimed is:

1. A method of manufacturing an array substrate for use in a thin film transistor liquid crystal display device, comprising:

depositing sequentially a first opaque conductive metal layer and a first transparent conductive metal layer on a substrate;

patterning the first opaque conductive metal layer and the first transparent conductive metal layer using a first mask to form a gate line and a gate pad, the gate line connected with the gate pad at an end portion thereof;

depositing sequentially a first insulating layer, an intrinsic semiconductor layer, a doped semiconductor layer and a second opaque conductive metal layer on the exposed surface of the substrate while covering the gate line and the gate pad;

patterning simultaneously the intrinsic semiconductor layer, the doped semiconductor layer and the second opaque conductive layer using a second mask to form a data line and a data pad, the data line perpendicular to the gate line and connected with the data pad at an end portion thereof and having a protruding portion at a cross portion of the gate and data line, the protruding portion extending toward a longitudinal direction of the gate line;

depositing a second transparent conductive metal layer over the whole surface of the substrate while covering the data line and the data pad;

patterning simultaneously the seconding transparent conductive metal layer, the second opaque conductive metal layer and the doped semiconductor layer using a third mask to form a transparent electrode layer, a source electrode, a drain electrode and a pixel electrode and to expose a channel area of the intrinsic semiconductor layer, the transparent electrode layer formed on the data line and the data pad and having the similar shape to the data line and the data pad and having a greater area than the data line and a smaller area than the data pad, the source and drain electrodes spaced apart from each other, the pixel electrode extending from the drain electrode;

forming a second insulating layer over the whole surface of the substrate while covering the transparent electrode layer, the source and drain electrodes and the pixel electrode; and patterning the second insulating layer to cover the gate line and the gate pad, patterning simultaneously portions of the first and second insulating layer on the gate pad to form a gate pad contact hole, and patterning portions of the first insulating layer between the data line and the pixel electrode, using a fourth mask.

2. The method of claim 1, wherein the first and second opaque conductive metal layer is made of one of aluminum, aluminum alloy, Cr, Mo, W and Ta.

3. The method of claim 1, wherein the first and second transparent conductive metal layer is made of one of indium tin oxide and indium zinc oxide.

4. The method of claim 1, wherein the first insulating layer is made of one of $SiO_2$ and SiNx, and the second insulating layer is made of one of $SiO_2$, SiNx, benzocyclobutene (BCB) and acrylic-based resin.

5. The method of claim 1, wherein the first insulating layer includes silicon atoms.

6. The method of claim 1, wherein the second insulating layer includes silicon atoms.

7. The method of claim 1, wherein the second insulating layer includes benzocyclobutene.

8. The method of claim 1, wherein the second transparent conductive layer includes indium atoms.

9. The method of claim 1, wherein the first opaque conductive metal layer includes aluminum atoms.

10. An array substrate fabricated by a method comprising the steps of:

(a) depositing a first metallic conductor on an exposed surface of a substrate;

(b) patterning said first metallic conductor using a first mask to produce a gate line and a gate pad that are connected together;

(c) depositing an insulating layer, an intrinsic semiconductor layer, a doped semiconductor layer, and a second metallic layer over a surface that results from step (a);

(d) patterning said intrinsic semiconductor layer, said doped semiconductor layer, and said second metallic layer using a second mask so as to form a data line and a data pad that are interconnected, wherein said data line crosses said gate line, and wherein said data line includes a protruding portion near said crossing and that extends along said gate line;

(e) depositing a blanketing conductive layer over a surface that results from step (d):

(f) patterning said blanketing conductive layer deposited in step (d), and said second metallic layer and said doped semiconductor layer deposited in step (c) using a third mask so as to form an electrode layer, a source electrode, a drain electrode, a pixel electrode, and an exposed channel area of the intrinsic semiconductor layer;

(g) depositing a passivation layer over a surface that results from step (f); and (h) patterning said passivation layer and said insulating layer to form a gate pad contact hole.

11. An array substrate fabricated according to claim 10, wherein the step of depositing the first metallic conductor includes steps of depositing both a base metal layer and an overlay layer such that said first metallic conductor has a dual layer structure.

12. An array substrate fabricated according to claim 11, wherein the step of depositing said base metal layer deposits at least one metal from a group comprised of aluminum or an aluminum alloy.

13. An array substrate fabricated according to claim 11, wherein the step of depositing said overlay layer deposits a material from a group comprised of indium tin oxide and indium zinc oxide.

14. An array substrate fabricated according to claim 11, wherein step (d) produces said data line such that said data line is perpendicular to said gate line.

15. An array substrate fabricated according to claim 11, wherein step (e) is performed by depositing said blanketing conductive layer so as to form a transparent layer.

16. An array substrate fabricated according to claim 11, wherein step (e) is performed by depositing a material from a group comprised of indium tin oxide and indium zinc oxide.

17. An array substrate fabricated according to claim 15, wherein step (f) produces a transparent electrode layer.

18. An array substrate fabricated according to claim 11, wherein step (f) produces a transparent pixel electrode.

19. An array substrate fabricated according to claim 11, wherein step (f) produces an electrode layer over said data line.

20. An array substrate fabricated according to claim 19, wherein said electrode layer over said data line has a similar shape as said data line, but has a smaller area.

21. An array substrate fabricated according to claim 11, wherein step (f) produces an electrode layer over said data pad.

22. An array substrate fabricated according to claim 21, wherein said electrode layer over said data pad has a similar shape as said data pad, but has a larger area.

23. An array substrate fabricated according to claim 11, wherein step (h) leaves said passivation material over said gate line and over said data pad.

24. An array substrate fabricated according to claim 11, wherein step (h) removes insulating material between said data line and said pixel electrode.

25. An array substrate fabricated according to claim 11, wherein step (h) leaves said passivation material over said source electrode and over said drain electrode.

* * * * *